(12) United States Patent
Xin

(10) Patent No.: US 10,050,023 B2
(45) Date of Patent: Aug. 14, 2018

(54) SOLID STATE LIGHTING DEVICE WITH DIFFERENT ILLUMINATION PARAMETERS AT DIFFERENT REGIONS OF AN EMITTER ARRAY

(71) Applicant: Micron Technology, Inc., Boise, ID (US)

(72) Inventor: Zhang Xin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/402,014

(22) Filed: Jan. 9, 2017

(65) Prior Publication Data

US 2017/0117258 A1   Apr. 27, 2017

Related U.S. Application Data

(60) Division of application No. 14/048,791, filed on Oct. 8, 2013, now Pat. No. 9,577,168, which is a continuation of application No. 12/816,238, filed on Jun. 15, 2010, now Pat. No. 8,550,647.

(51) Int. Cl.
| | |
|---|---|
| *H01L 25/075* | (2006.01) |
| *H01L 33/62* | (2010.01) |
| *H01L 33/50* | (2010.01) |
| *H01L 33/56* | (2010.01) |
| *H01L 33/58* | (2010.01) |

(52) U.S. Cl.
CPC ........ *H01L 25/0753* (2013.01); *H01L 33/502* (2013.01); *H01L 33/56* (2013.01); *H01L 33/58* (2013.01); *H01L 33/62* (2013.01); *H01L 2933/005* (2013.01); *H01L 2933/0041* (2013.01); *H01L 2933/0066* (2013.01)

(58) Field of Classification Search
CPC ................................. G02F 1/133611
See application file for complete search history.

(56) References Cited

U.S. PATENT DOCUMENTS

| | | |
|---|---|---|
| 6,194,839 B1 | 2/2001 | Chang |
| 6,201,353 B1 | 3/2001 | Chang et al. |
| 6,366,025 B1 | 4/2002 | Yamada |

(Continued)

FOREIGN PATENT DOCUMENTS

| | | |
|---|---|---|
| KR | 1020090071607 A | 7/2009 |
| WO | 2009011292 A1 | 1/2009 |

*Primary Examiner* — Anh Mai
*Assistant Examiner* — Zachary J Snyder
(74) *Attorney, Agent, or Firm* — Perkins Coie LLP

(57) ABSTRACT

Solid state lighting (SSL) devices and methods of manufacturing such devices. One embodiment of an SSL device comprises a support and an emitter array having a plurality of SSL emitters carried by the support. The emitter array has a central region and a peripheral region outward from the central region. Individual SSL emitters in both the central and the peripheral regions have a primary emission direction along which an intensity of light from the SSL emitters is highest, and the primary emission direction of the SSL emitters in the central region is at least substantially the same direction as the primary emission direction of the SSL emitters in the peripheral region. Additionally, a first coverage area ratio of the SSL emitters in the central region is different than a second coverage area ratio of the SSL emitters in the peripheral region.

11 Claims, 10 Drawing Sheets

(56) References Cited

U.S. PATENT DOCUMENTS

| | | | |
|---|---|---|---|
| 6,635,987 B1 | 10/2003 | Wojnarowski | |
| 6,867,549 B2 | 3/2005 | Arnold | |
| 7,285,903 B2 | 10/2007 | Haim | |
| 7,559,664 B1 | 7/2009 | Walleman | |
| 2002/0006040 A1 | 1/2002 | Kamada | |
| 2004/0113875 A1 | 6/2004 | Miller | |
| 2004/0201558 A1 | 10/2004 | Arnold | |
| 2004/0217694 A1 | 11/2004 | Cok | |
| 2007/0029915 A1* | 2/2007 | Kim | G09G 3/3413 313/483 |
| 2007/0195524 A1 | 8/2007 | Seo | |
| 2008/0062691 A1 | 3/2008 | Villard | |
| 2009/0002985 A1 | 1/2009 | Peck | |
| 2009/0091947 A1 | 4/2009 | Chou | |
| 2009/0207605 A1 | 8/2009 | Fields | |
| 2010/0020267 A1 | 1/2010 | Kobayashi | |
| 2010/0053496 A1* | 3/2010 | Park | G02F 1/133603 349/61 |
| 2010/0073941 A1 | 3/2010 | Ho | |
| 2010/0157595 A1 | 6/2010 | Lin | |
| 2011/0305021 A1 | 12/2011 | Xin | |

* cited by examiner

SOLID STATE LIGHTING DEVICE WITH DIFFERENT ILLUMINATION PARAMETERS AT DIFFERENT REGIONS OF AN EMITTER ARRAY

CROSS-REFERENCE TO RELATED APPLICATION

This application is a divisional of U.S. application Ser. No. 14/048,791 filed Oct. 8, 2013, which is a continuation of U.S. application Ser. No. 12/816,238 filed Jun. 15, 2010, now U.S. Pat. No. 8,550,647, each of which is incorporated herein by reference in its entirety.

TECHNICAL FIELD

The present technology generally relates to solid state lighting ("SSL") devices with different illumination parameters between selected subsets of SSL emitters in different areas of the emitter array. In particular, several embodiments of the present technology are related to SSL devices that include a plurality of SSL emitters, such as a plurality of individual light emitting diodes (LEDs), arranged with different densities, coverage ratios, spacing between neighboring SSL emitters, sizes of SSL emitters, and other features that produce a desired light output intensity distribution across the array.

BACKGROUND

Mobile phones, personal digital assistants (PDAs), electronic pads, media players, digital cameras, MP3 players, televisions, monitors, interior and exterior lights, and other electronic devices use SSL devices (e.g., white light LEDs) for illumination. However, true white light LEDs are not available because LEDs typically emit light at only one particular wavelength. For human eyes to perceive the color white, a mixture of wavelengths is needed.

One conventional technique for emulating white light with LEDs includes depositing a converter material (e.g., a phosphor) on an LED. For example, FIG. 1A shows a conventional SSL device 10 that includes a support 2, an LED 4 attached to the support 2, and a converter material 6 on the LED 4. The LED 4 can include one or more light emitting components. For example, as shown in FIG. 1B, the LED 4 can include a silicon substrate 12, an N-type gallium nitride (GaN) material 14, an indium gallium nitride (InGaN) material 16 (and/or GaN multiple quantum wells), and a P-type GaN material 18 on one another in series. The LED 4 can be a lateral-type device that includes a first contact 20 on the P-type GaN material 18 and a second contact 22 on the N-type GaN material 14 spaced laterally apart from the first contact 20. Referring to both FIGS. 1A and 1B, the LED 4 emits blue light that stimulates the converter material 6 to emit light at a desired frequency (e.g., yellow light). The combination of the emissions from the LED 4 and the converter material 6 appears white to human eyes if the wavelengths of the emissions are matched appropriately.

FIG. 2A is a cross-sectional view of a conventional multi-LED device having a support 52, a plurality of LEDs 4 attached to the support 52, and a converter material 56 over the support 52 and the LEDs 4. The multi-LED device 50 also has a single lens 58 over the LEDs 4. All of the LEDs 4 are commonly connected to a common anode and cathode such that all of the LEDs 4 operate together. FIG. 2B is a top plan view of a common pattern for the LEDs 4 in conventional multi-LED devices. For example, conventional multi-LED devices typically have a two-dimensional grid of identical LEDs in which adjacent LEDs are spaced apart from each other by a constant distance throughout the entire array.

One drawback of the conventional multi-LED device 50 with a uniform LED distribution is that the intensity of light is greater at the center of the array than at the edge of the device. Such a non-uniform intensity distribution reduces the quality for backlighting and other applications because it creates dark spots around the edge of the array. For example, the light output intensity is substantially less at the corners of the multi-LED device 50 than at the center. To reduce the non-uniformity of conventional multi-LED devices, several manufacturers provide a diffusion film that diffuses light at the center of the LED array. Such diffusion films accordingly reduce the intensity of the light at the center of LED array, but this is undesirable because it reduces the overall light output and efficiency of multi-LED devices.

DETAILED DESCRIPTION

Various embodiments of SSL devices and associated methods of manufacturing SSL devices are described below. The term "SSL emitter" generally refers to solid state components that convert electrical energy into electromagnetic radiation in the visible, ultraviolet, infrared and/or other spectra. SSL emitters include "LEDs," which are semiconductor diodes that convert electrical energy into electromagnetic radiation in a desired spectrum. The term "phosphor" generally refers to a material that can continue emitting light after exposure to energy (e.g., electrons and/or photons). A person skilled in the relevant art will also understand that the technology may have additional embodiments and/or may be practiced without several of the details of the embodiments described below with reference to FIGS. 3A, 3B, 4A, 5A and 6-11.

Figure 3A:
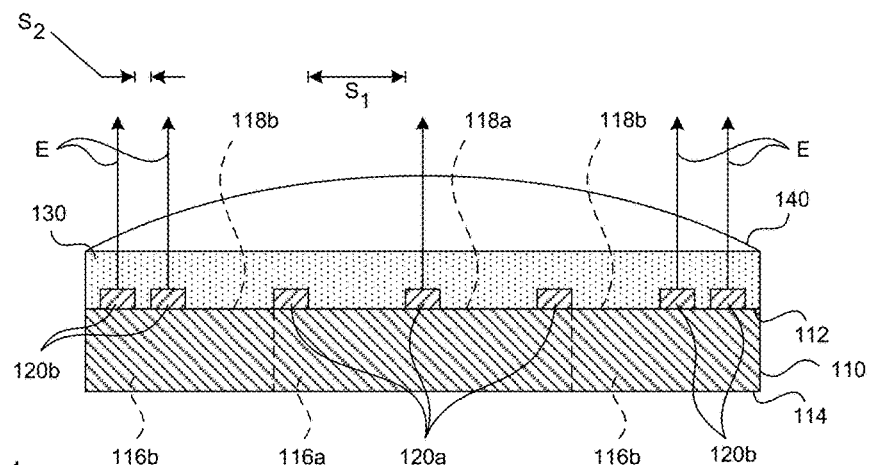
FIG. 3A is a cross-sectional view and FIG. 3B is a top plan view of an SSL device in accordance with an embodiment of the technology.
Figure 3B:
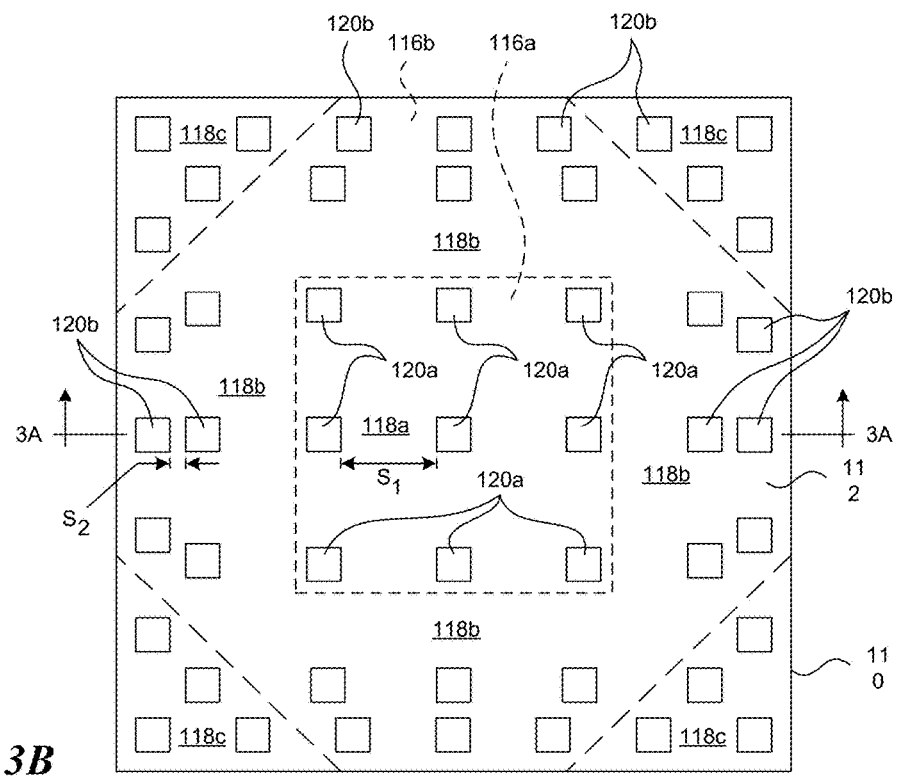

FIG. 3A is a cross-sectional view and FIG. 3B is a top plan view of an SSL device 100 in accordance with an embodiment of the technology. FIG. 3A, more specifically, is a cross section along line 3A-3A of FIG. 3B. Referring to FIG. 3A, this particular embodiment of the SSL device 100 includes a support 110 and a plurality of SSL emitters 120 (identified individually by reference numbers 120a and 120b). The SSL device 100 can optionally include a converter material 130 over the SSL emitters 120 and a conditioning element 140 (e.g., a lens and/or diffuser). In this embodiment, the SSL emitters 120 are arranged on the support 110 such that size, shape, spacing, intensity and/or other parameter of the SSL emitters in a central region of the emitter array is different than at least one of the corresponding parameters of the SSL emitters in a peripheral region of the emitter array.

The support 110 can have a front surface 112, a back surface 114, a first portion 116a, and a second portion 116b. The first and second portions 116a-b are not necessarily separate components, but rather they can be integral sectors of the same printed circuit device, metal base, or other type of support structure. Referring to FIGS. 3A and 3B, the front surface 112 of the support 110 can have a first emission area 118a and a second emission area 118b corresponding to the first portion 116a and the second portion 116b of the support 110, respectively. The second emission area 118b is outward of the first emission area 118a, and in several embodiments the second emission area 118b surrounds the first emission area 118a. The first emission area 118a can accordingly define a central region and the second emission area 118b can define a peripheral region. The second emission area 118b, more specifically, can be the peripheral-most region of the active lighting area of the SSL device 100.

The SSL emitters 120 can include a set of first SSL emitters 120a in the first emission area 118a and a set of second SSL emitters 120b in the second emission area 118b. All of the first and second SSL emitters 120a-b can be identical, or in other embodiments the first SSL emitters 120a can have a different size, shape, color, intensity and/or other parameter than the second SSL emitters 120b. The parameters of the SSL emitters 120a-b can also be mixed in both regions 118a and 118b. As described in further detail below, the first and second SSL emitters 120a-b can be arranged in the first and second emission areas 118a-b to provide a more uniform light output than conventional multi-LED devices.

The first set of SSL emitters 120a cover a first proportion of the first emission area 118a to define a first coverage area ratio and the second set of SSL emitters 120b cover a second proportion of the second emission area 118b to define a second coverage area ratio different than the first coverage area ratio. In several embodiments of the SSL device 100, the first coverage area ratio is less than the second coverage area ratio. The coverage area ratios for each of the first and second emission areas 118a and 118b are selected to provide the desired light distribution across the array of SSL emitters. In applications that require additional output at the perimeter of the array, the second coverage area ratio is selected to be sufficiently greater than the first coverage area ratio such that the combined light from the first and second emission areas 118a and 118b is more uniform across the array compared to arrays that have a constant coverage area ratio from the center to the perimeter of the array.

The SSL device 100 is not limited to having only two emission area 118a and 118b, but rather the array can be divided into any number of emission areas in which the coverage area ratios are selected to provide a desired light intensity distribution. This can be useful in arrays where the light output at the corners of the array is substantially less than center of the array or at the midpoints along the sides of the array perimeter. For example, one embodiment of the SSL device 100 shown in FIG. 3B has third emission areas 118c at the corners of the array with a third coverage area ratio greater than either first or the second coverage area ratios.

The different coverage area ratios of the SSL emitters in different emission areas of the array can be achieved by appropriately selecting one or more of the following: (a) density of SSL emitters, (b) spacing between neighboring SSL emitters, (c) vacant regions between emission areas, (d) size of the SSL emitters, (e) shape of the SSL emitters, (f) intensity of the SSL emitters, and/or other parameters related to the cumulative light output of the SSL emitter array. For example, FIG. 3B shows that neighboring (e.g., adjacent) first SSL emitters 120a are spaced apart by a first distance S1 and neighboring second SSL emitter 120b are spaced apart by a second distance S2 less than S1. As shown in FIG. 3B, the second SSL emitters 120b can be spaced apart from other neighbors in the second emission area 118b by other distances as well, but when viewed as a whole the number of second SSL emitters 120b per unit surface area (e.g., the density of SSL emitters) is greater in the second emission area 118b than that of first SSL emitters 120a in the first emission area 118a. The spacing between the SSL emitters 120 can vary in one dimension of the array (e.g., one-dimensional spacing), or as shown in FIG. 3B the spacing can vary in two dimensions of the array (e.g., two-dimensional spacing).

Referring to FIG. 3A, the individual SSL emitters 120a-b in both the first and second emission areas 118a-b have a primary emission direction E along which an intensity of light from the SSL emitters 120a-b is the highest. The primary emission direction E of each emitter is generally perpendicular to the face of each emitter. In the embodiment illustrated in FIG. 3A, the primary emission direction E of the first SSL emitters 120a in the first emission area 118a is at least substantially the same direction as the primary emission direction E of the second SSL emitters 120b in the second emission area 118b. The first and second emission areas 118a-b that define the central and peripheral regions accordingly face outwardly such that light projects away from the first and second emission areas 118a-b of the support 110.

Figure 2A:
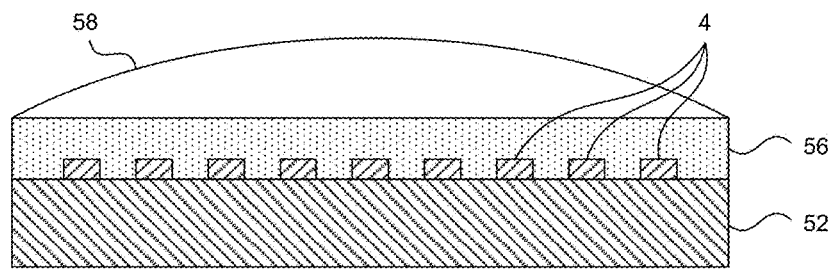
FIG. 2A is a cross-sectional view and FIG. 2B is a top plan view of a conventional multi-LED device in accordance with the prior art.
Figure 2B:
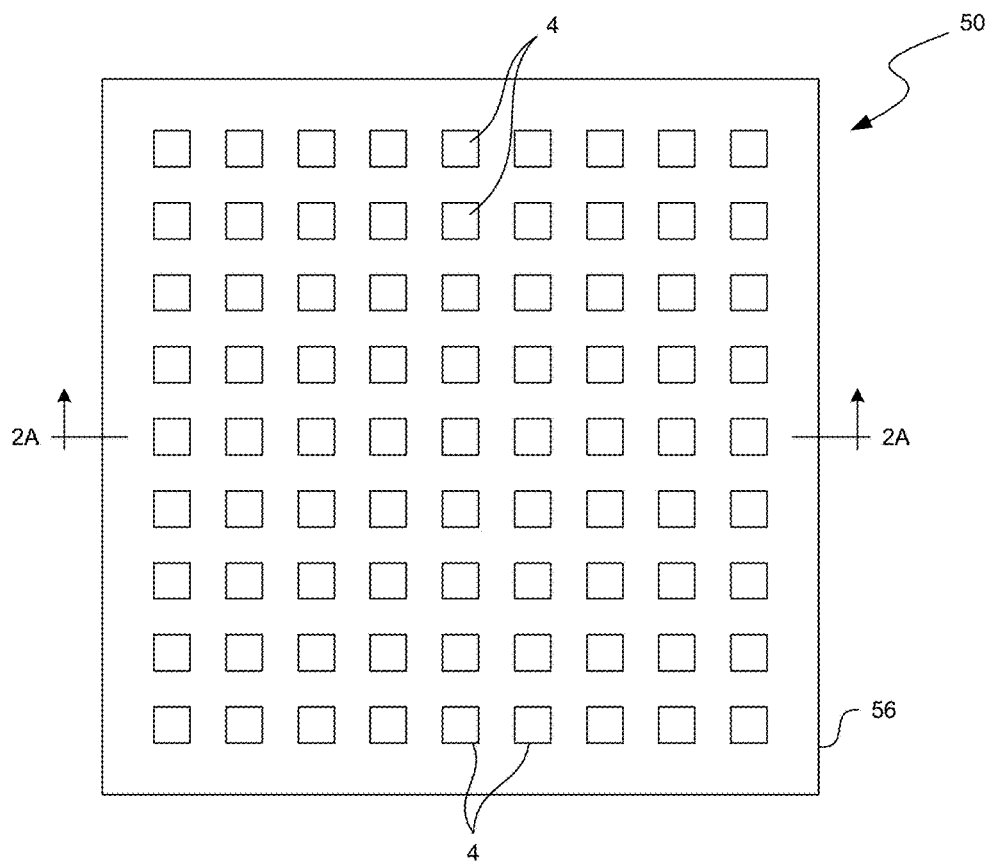
Figure 4A:
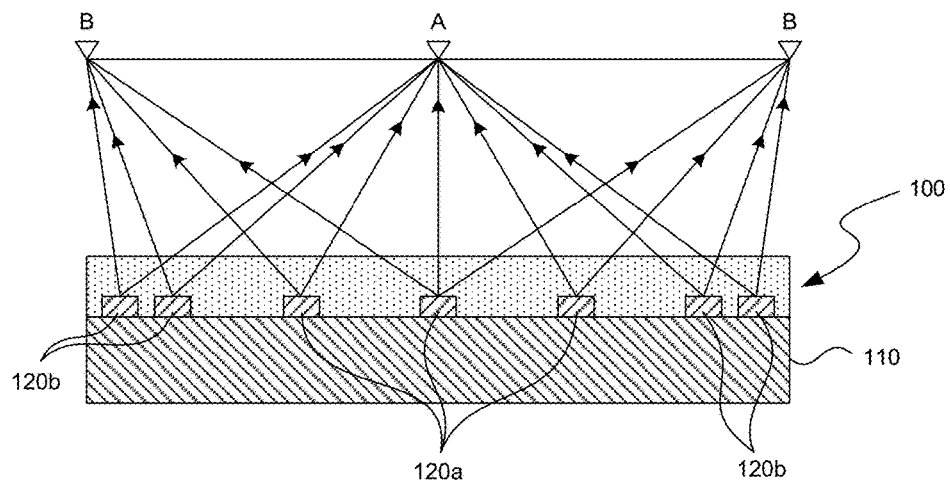
FIG. 4A is a cross-sectional view illustrating the operation of an SSL device in accordance with an embodiment of the technology.
Figure 4B:
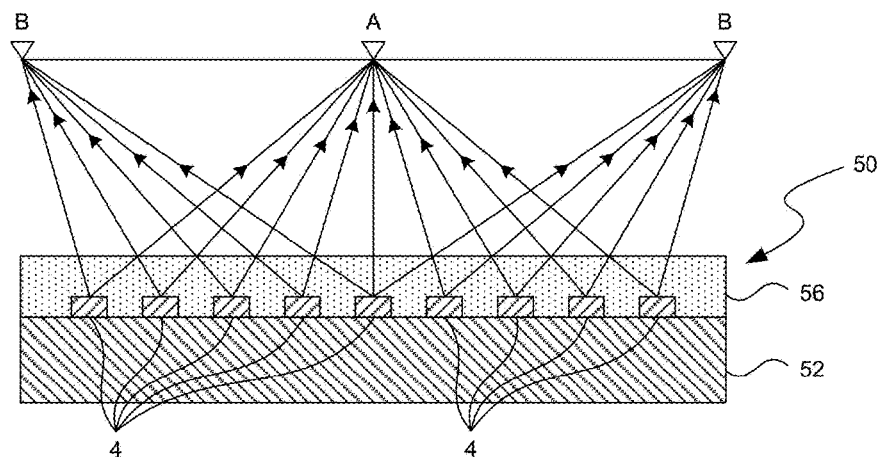
FIG. 4B is a cross-sectional view illustrating the operation of a conventional multi-LED device in accordance with the prior art.

FIG. 4A is a cross-sectional view illustrating the operation of an embodiment of the SSL device 100 described above with reference to FIGS. 3A and 3B, and FIG. 4B is a cross-sectional view illustrating the operation of the conventional multi-LED device 50 described above with reference to FIGS. 2A and 2B. FIGS. 4A and 4B show the light received along a plane at points B above the perimeter of the array and at a point A above the center of the array from within a distance of half of the total array width. The intensity of light from a given SSL emitter is greatest along its primary emission axis (i.e., the axis perpendicular to the face of the SSL emitter) and decreases as a square of the distance from the SSL emitter. Referring to FIG. 4B, the intensity of light at points B for the multi-LED device 50 is less than the intensity of light at point A because point A receives more light on or near the primary emission axes of more LEDs than points B, and point A is closer to more of the LEDs than points B. Several embodiments of the SSL device 100 shown in FIG. 4A reduce or eliminate the difference in the light intensity between point A and points B because the different coverage area ratios of the first and second SSL emitters 120a-b decreases the density of SSL emitters proximate to point A relative to points B.

Figure 5A:
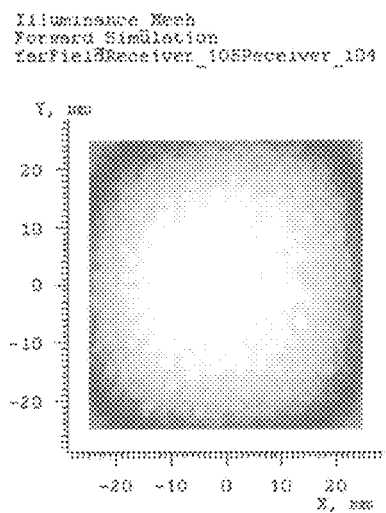
FIG. 5A is a plot of a light output intensity distribution of an SSL device in accordance with an embodiment of the technology.
Figure 5A:
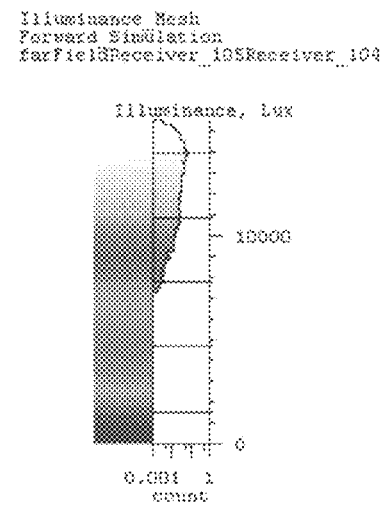
Figure 5B:
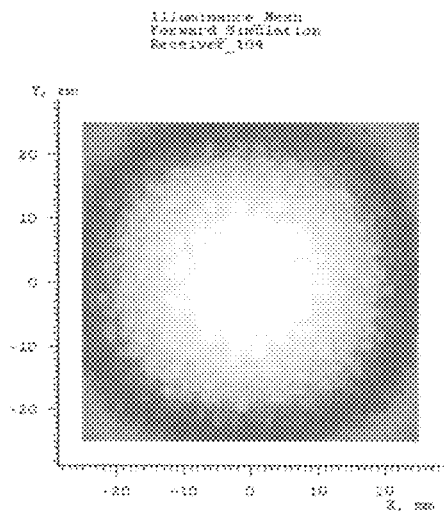
FIG. 5B is a plot of a light output intensity distribution of a conventional multi-LED device in accordance with the prior art.
Figure 5B:
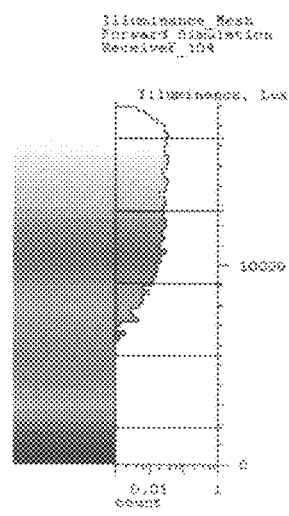

FIG. 5A is a plot of the intensity distribution for an embodiment of the SSL device 100, and FIG. 5B is a plot of the intensity distribution for the multi-LED device 50. In comparing FIGS. 5A and 5B, the light intensity is higher and more uniform across more of the array area of the SSL device 100 than the conventional multi-LED device 50. Several embodiments of the SSL device 100 accordingly provide a highly uniform light output across a significant portion of the surface area of the array that reduces dark spots or other irregularities of the light output. Additionally, several embodiments of the SSL device 100 can provide such uniformity without a diffusion material over the center of the array that reduces the light output from the center of the array. Several embodiments of the SSL device 100 are thus more efficient than conventional multi-LED devices with diffusion layers over the center of the array.

Figure 6:
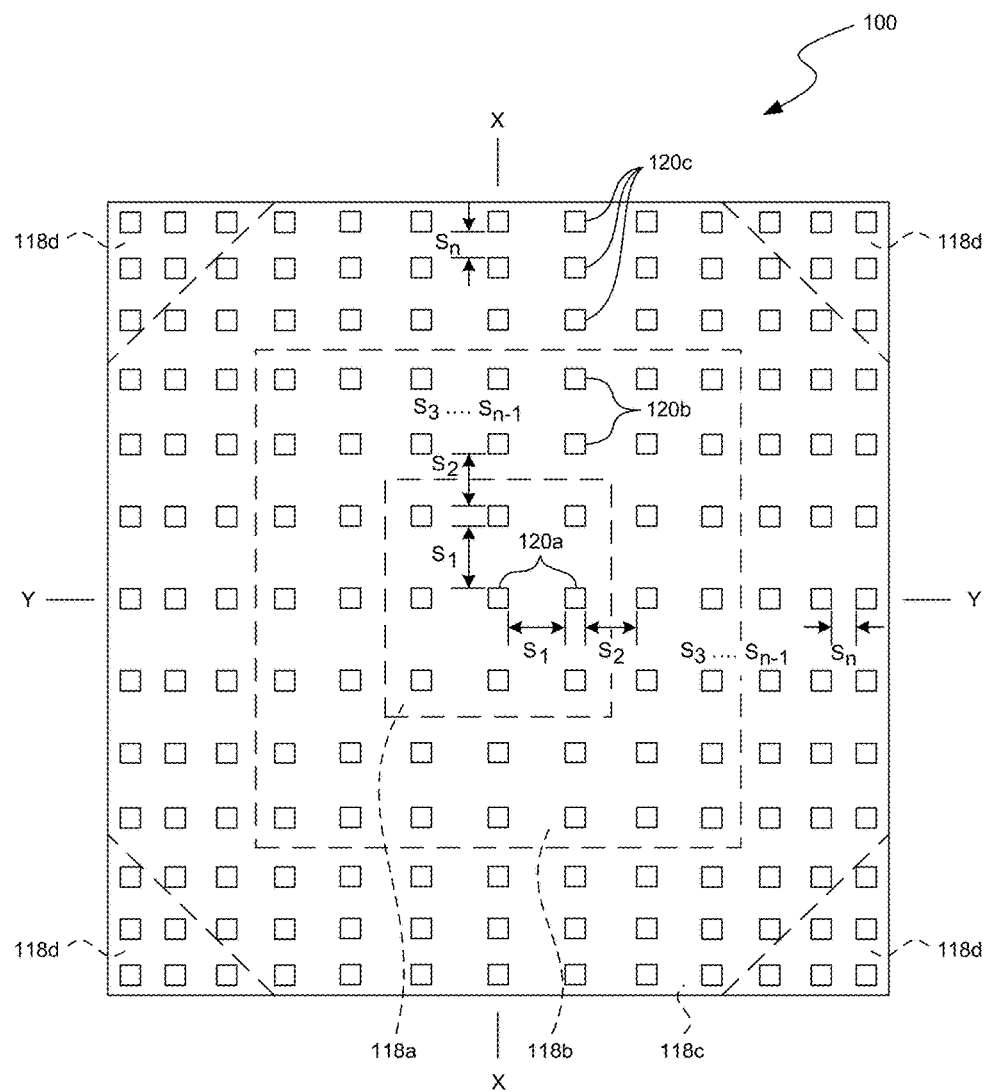
FIG. 6 is a top plan view of an SSL device in accordance with another embodiment of the technology.

FIG. 6 is a top plan view of an SSL device 100 in accordance with another embodiment of the technology. In this embodiment, the SSL emitters 120 are arranged such that the coverage area ratio increases progressively with increasing distance from the center of the SSL array. For example, the spacing between each successive row and/or column of SSL emitters 120 can decrease from the center such that S1>S2>S3 . . . Sn-1>Sn, where S1 is the spacing between the center-most SSL emitter 120 and adjacent emitters and Sn is the spacing between the peripheral-most SSL emitters 120 and adjacent emitters toward the center of the array. The spacing between the SSL emitters 120 in the embodiment shown in FIG. 6 can decrease symmetrically along both the X and Y dimensions (i.e., two-dimensional coverage area ratio variation) or along only one of the X or Y dimensions (i.e., one-dimensional coverage area ratio variation). In other embodiments, the spacing between neighboring or adjacent SSL emitters 120 can change asymmetrically along one or both of the X and/or Y dimensions of the array.

The SSL emitter array of the SSL device 100 shown in FIG. 6 can have any number of different emission areas depending on the application. For example, the surface of the array can be mapped into three emission areas that define the first emission area 118a, second emission area 118b, and third emission area 118c. The SSL emitters 120 can accordingly have first SSL emitters 120a in the first emission area 118a, second SSL emitters 120b in the second emission area 118b, and third SSL emitters 120c in the third emission area 118c. The embodiment of the SSL device 100 shown in FIG. 6 can have a first coverage area ratio in the first emission area 118a and a second coverage area ratio in the second emission area 118b greater than the first coverage area. Similarly, the SSL device 100 shown in FIG. 6 can have a third coverage area ratio in the third emission area 118c greater than the second coverage area ratio. The SSL device 100 can also have fourth emission areas 118d in the corners that have a fourth coverage area ratio higher than the second coverage area ratio, and in some embodiments the fourth coverage area ratio is also greater than the third coverage area ratio.

Figure 7:
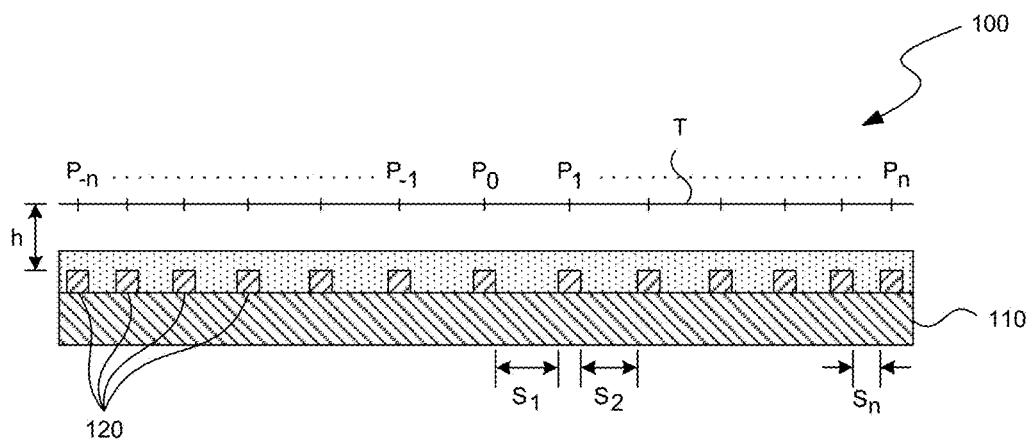
FIG. 7 is a schematic cross-sectional view illustrating a process for arranging SSL emitters in an array of an SSL device in accordance with an embodiment of the technology.

FIG. 7 is a schematic view illustrating a cross-section of the SSL device 100 shown in FIG. 6. The spacing S1, S2, Sn between adjacent SSL emitters 120 can be determined empirically using light output models. For example, the output of each SSL emitter 120 can be modeled for a number of points P-n . . . P0 . . . Pn at a target surface T spaced apart from the array by a distance h. The sum of the light outputs from the all of the SSL emitters 120 for each point is then determined, and the arrangement of the SSL emitters 120 is adjusted such that the cumulative light output at the points across the target surface T provides the desired light intensity distribution across the SSL emitter array. In another embodiment, the spacing between adjacent SSL emitters 120 can be calculated assuming that the light from the SSL emitters 120 has a Lambertian Angular distribution.

Figure 8:
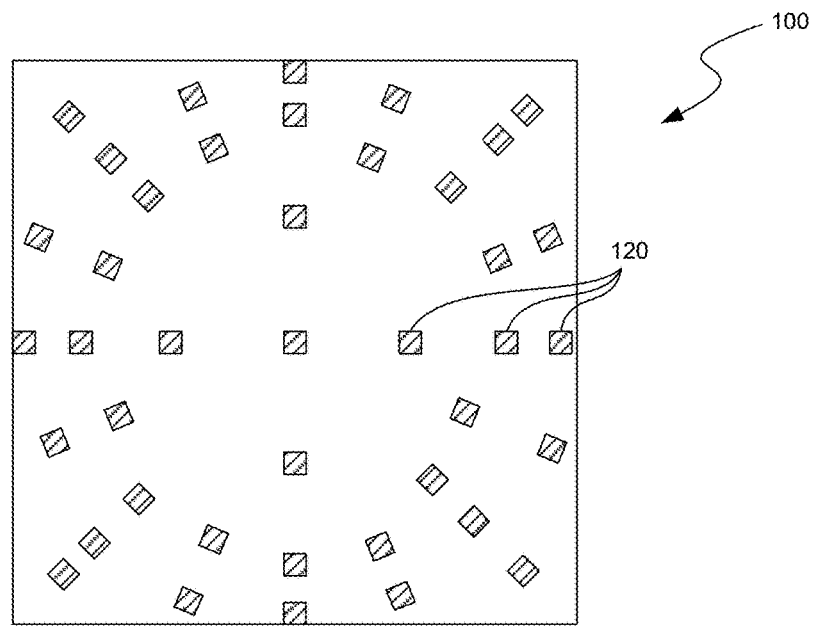
FIG. 8 is a top plan view of an SSL device in accordance with another embodiment of the technology.

FIG. 8 is a top plan view of another embodiment of the SSL device 100 in accordance with the technology in which the SSL emitters 120 are arranged along radians projecting from the center of the array instead of in rows and columns of an X-Y grid. In the embodiment of the SSL device shown in FIG. 8, the SSL emitters 120 are arranged along 16 radians spaced apart from each other by 22.5°, and the number and spacing of the SSL emitters 120 can vary along different radians. The arrangement of SSL emitters 120 shown in FIG. 8 is merely illustrative such that many other configurations of SSL emitters 120 along fewer or more radians can be selected in a manner similar to the process described above with respect to FIG. 7.

Figure 9:
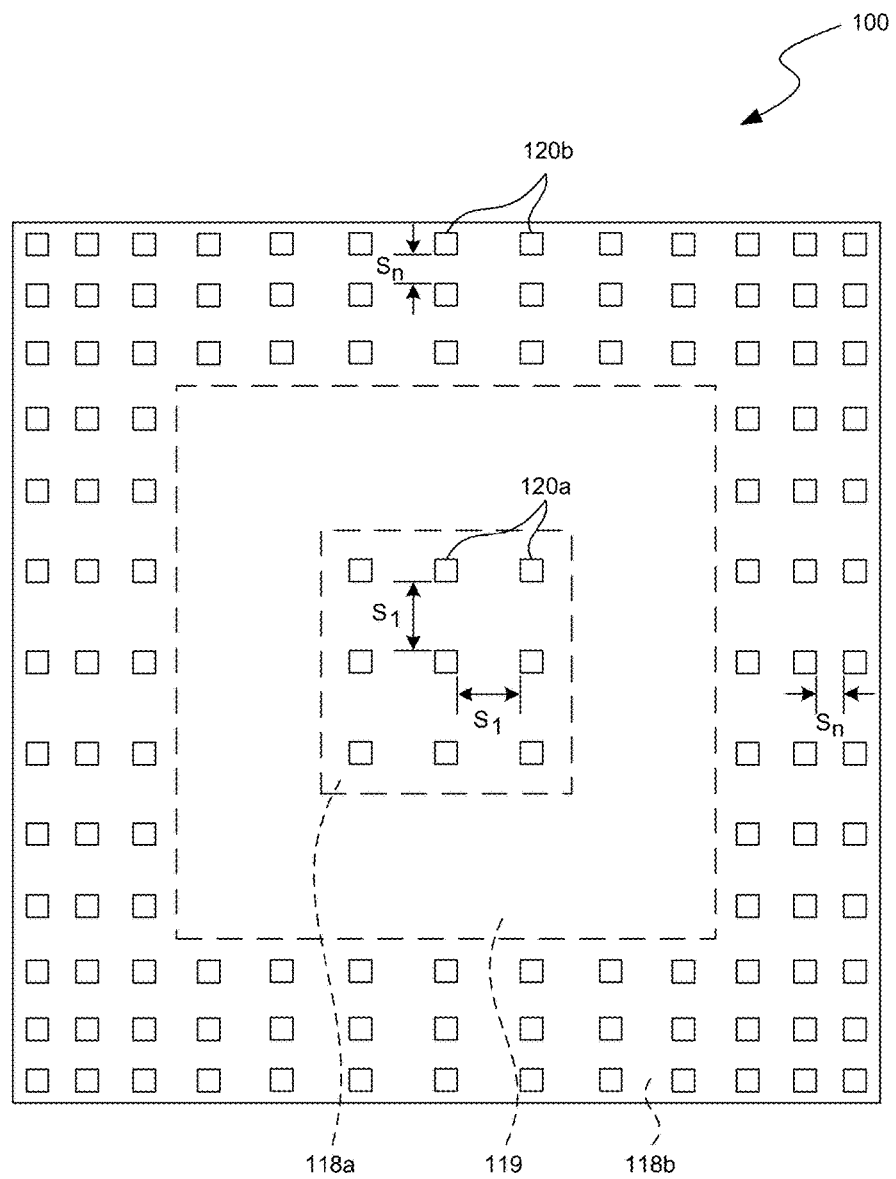
FIG. 9 is a top plan view of an SSL device in accordance with another embodiment of the technology.

FIG. 9 is a top plan view of an SSL device 100 in accordance with another embodiment of the technology. In this embodiment, the SSL emitter array has a first emission area 118a with first SSL emitters 120a, a second emission area 118b with second SSL emitters 120b, and a vacant region 119 between the first and second emission areas 118a-b. The first and second SSL emitters 120a-b can be arranged in the first and second emission areas 118a-b such that the first coverage area ratio in the first emission area 118a is less than the second coverage area ratio in the second emission area 118b as described above with respect to other embodiments of the SSL device 100. However, in some embodiments, the vacant region 119 can be configured such that coverage area ratio of the first and second emission areas 118a-b is the same.

Figure 10:
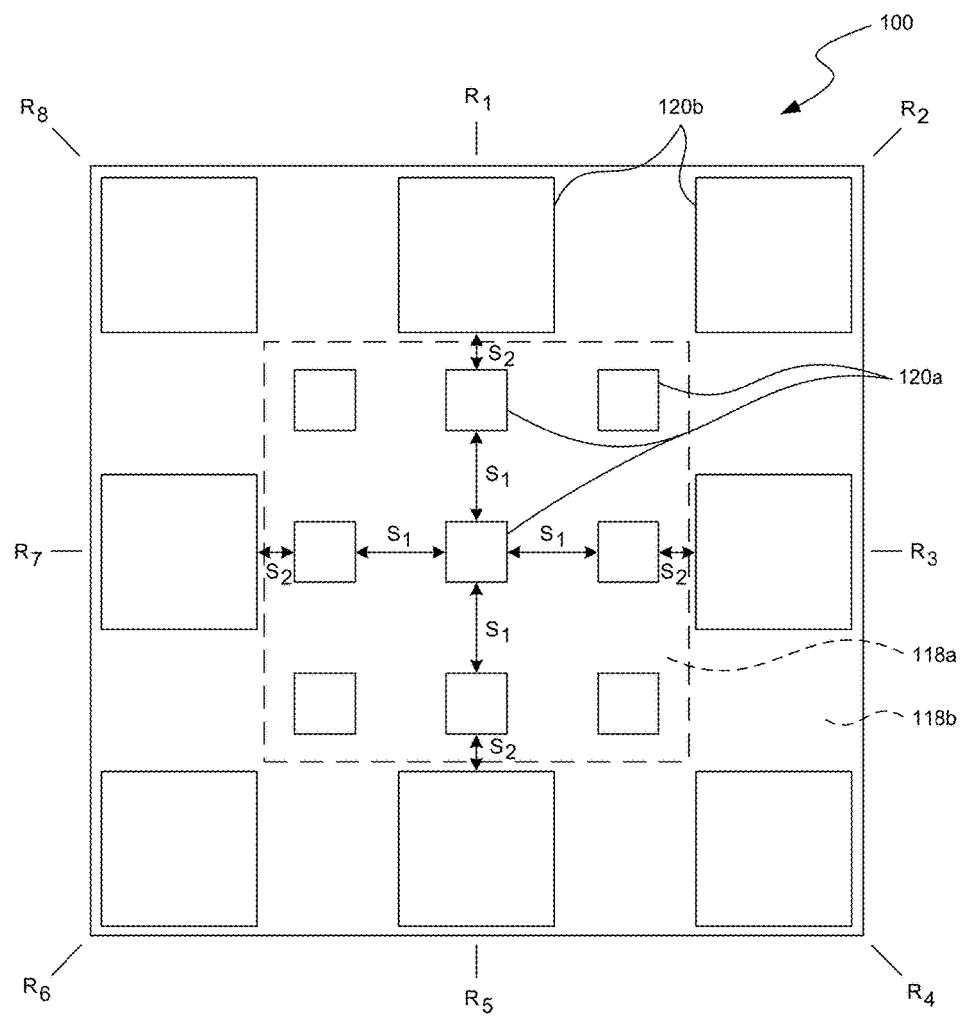
FIG. 10 is a top plan view of an SSL device in accordance with another embodiment of the technology.

FIG. 10 is a top plan view of another embodiment of the SSL device 100 in accordance with the technology. In this embodiment, the SSL device 100 has a plurality of first SSL emitters 120a having a first size in the first emission area 118a and a plurality of second SSL emitters 120b in the second emission area 118b having a second size different than the first size. For example, the second size of the second SSL emitters 120b can be greater than the first size of the first SSL emitters 120a such that the coverage area ratio of the second SSL emitters 120b in the second emission area 118b is greater than the coverage area ratio of the first SSL emitters 120a in the first emission area 118a. In the embodiment shown in FIG. 10, the first and second SSL emitters 120a-b are also arranged along eight radians R1-R8 spaced from each other by 45°, the first SSL emitters 120a are spaced apart from each other by a distance of S1, and the second SSL emitters 120b are spaced apart from the first SSL emitters 120a by distance S2 less than S1 along radians R1, R3, R5 and R7. In other embodiments, the SSL emitters 120a-b of different sizes can be spaced apart from each other by the same distance and/or be arranged in an X-Y grid or other configuration.

Figure 11:
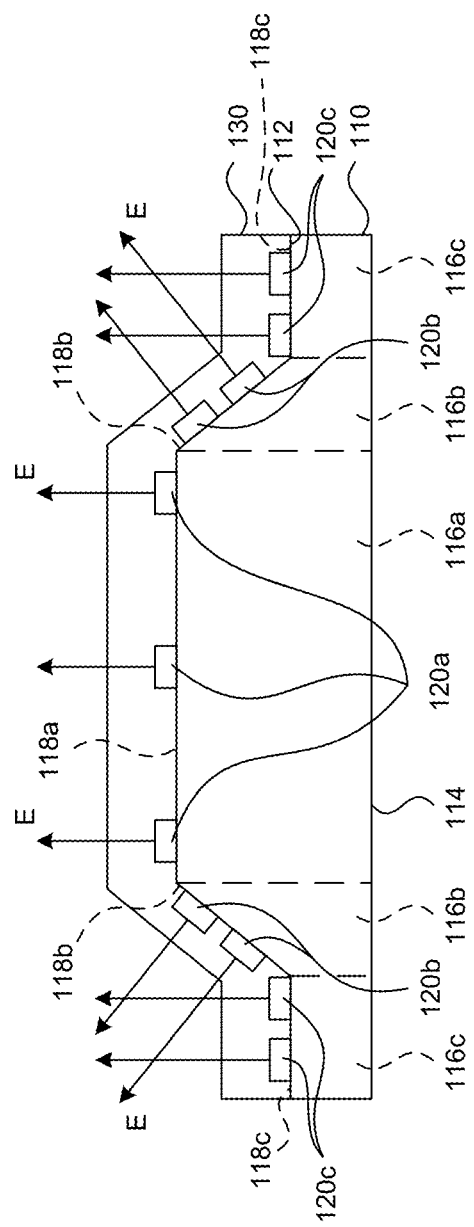
FIG. 11 is a cross-sectional view of an SSL device in accordance with another embodiment of the technology.

FIG. 11 is a side cross-sectional view of another embodiment of the SSL device 100 in accordance with the technology. In this embodiment, the SSL device 100 has a support 110 with first-third portions 116a-c, respectively, that define first-third emission areas 118a-c, respectively. The support 110 is configured such that the second emission area 118b is an inclined surface that slopes downwardly from the first emission area 118a to the third emission area 118c. The SSL device 100 in FIG. 11 also has a set of first SSL emitters 120a in the first emission area 118a, a set of second SSL emitters 120b in the second emission area 118b, and a set of third SSL emitters 120c in the third emission area 120c. The coverage ratios of the SSL emitters 120b-c in the second and third emission areas 118b-c can be different from each other and different from the coverage area ratio in the first emission area 118a. In the embodiment shown in FIG. 11, the coverage area ratios in the second and third emission areas 118b-c are equal to each other and greater than the coverage area ratio in the first emission area 118a. The first-third emission areas 118a-c all face outwardly relative to the SSL device 100 such that the primary emission directions E of the individual SSL emitters 120a-c all project away from the central region of the support 110.

Several additional configurations of first and second emitters 120a-b are also in accordance with the technology. For example, an SSL device can have a number "n" of first emitter(s) 120a and a number "p" of second emitters 120b where p>n such that the overall light distribution corresponds to a desired profile. In one embodiment, n can equal 1 and p can be 2 or more. In other embodiments, n can be greater than 1 and p greater than n.

The support 110 of any of the foregoing embodiments of the technology can be a printed circuit board having traces that define leads for providing power to the SSL emitters 120. In an alternative embodiment, the support 110 can be a base made from copper, aluminum, or another type of metal that has a first metal portion defining either an anode or a cathode, and a second metal portion electrically isolated from the first portion that defines the other of the cathode or anode. In still other embodiments, the support 110 can have a base made from ceramic or another suitable dielectric material and traces on the base. The front surface 112 of the support 110 can be flat, or in other embodiments the support 110 can include a plurality of depressions in which one or more of the SSL emitters 120 are positioned. The depressions, for example, can be cavities sized and shaped to receive a single SSL emitter 120. Suitable supports 110 for the SSL device 110 are shown and described in commonly owned U.S. Pat. No. 8,552,438, entitled "Multi-Lens Solid State Lighting Devices," which is incorporated herein by reference.

Figure 1A:
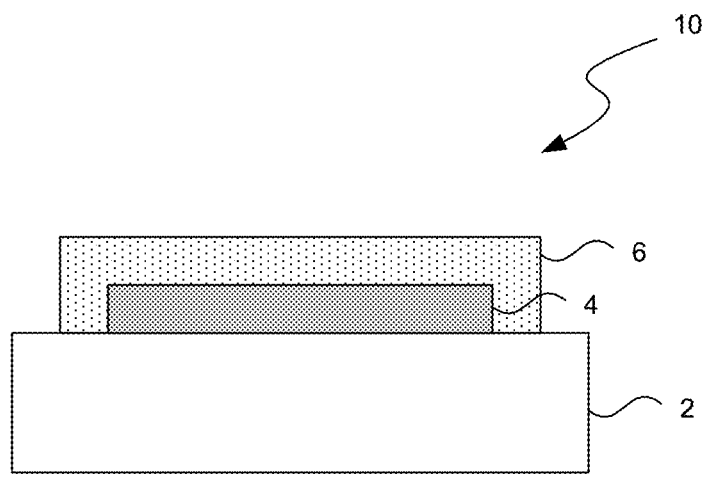
FIG. 1A is a cross-sectional view of a conventional SSL device in accordance with the prior art.
Figure 1B:
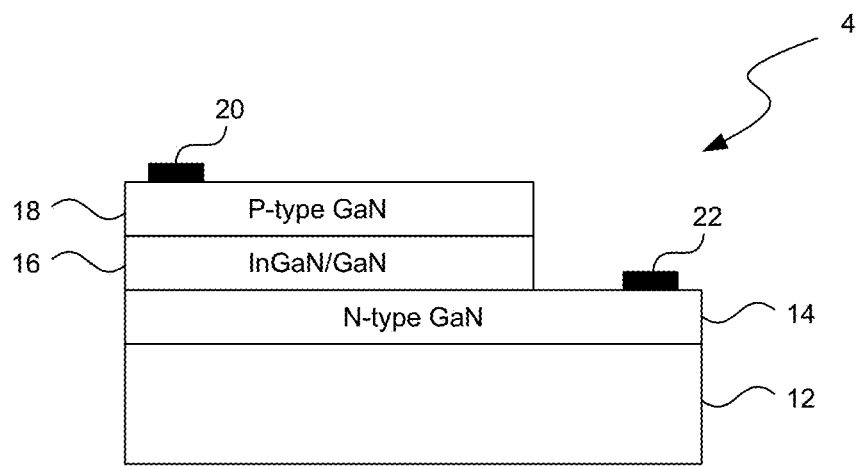
FIG. 1B is a cross-sectional view of a light emitting diode in accordance with the prior art.

The SSL emitters 120 of any of the foregoing embodiments can be LEDs configured to emit light in a desired spectrum. For example, the SSL emitters 120 can be configured to emit light in one or more of the following spectra: visible spectrum (e.g., from about 450 nm to about 650 nm); infrared spectrum (e.g., from about 680 nm to about 970 nm); near infrared spectrum (e.g., from about 1050 nm to about 1550 nm); and/or other suitable spectra. The SSL emitters 120 can be the same as the LED 4 shown in FIG. 1B; in other embodiments, the SSL emitters 120 can be vertical type LEDs in which one contact can be wire bonded to either the anodic or cathodic leads and the other contact can be surface mounted to the other of the anodic or cathodic leads. For example, contacts formed from copper (Cu), aluminum (Al), tungsten (W), stainless steel or other suitable metals or metal alloys on the backside of the SSL emitters 120 can be surface mounted to corresponding surface mount contacts on the support 110. In other embodiments, an n-type GaN material at the bottom of the SSL emitters 120 can define the backside contacts for surface mounting the SSL emitters to one of the leads. Suitable surface mounting configurations are shown and described in commonly owned U.S. Pat. No. 8,441,020 entitled "Light Emitting Diode Wafer-Level Package with Self-Aligning Features," which is incorporated herein by reference.

The optional converter material 130 of any of the foregoing embodiments (e.g., FIG. 3A) is selected to emit light at a wavelength that combines with the light from the SSL emitters 120 to create a desired color of light. The converter material 130, for example, can have a composition that emits light at a desired wavelength under stimulation such that the combination of the emissions from the SSL emitters 120 and the converter material 130 emulates a white light. For example, in one embodiment, the converter material 130 can include a phosphor containing cerium(III)-doped yttrium aluminum garnet (YAG) at a particular concentration for emitting a range of colors including green, yellow and/or red under photoluminescence. In other embodiments, the converter material 130 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. When light and/or energized particles from the SSL emitters 120 irradiates the converter material 130, the phosphor is energized and emits light with desired characteristics.

The conditioning element 140 of any of the foregoing embodiments (e.g., FIG. 3A) is optional and can be a lens configured to focus the light or a diffuser that diffuses the light. The conditioning element 140 can include a transmissive material made from silicone, polymethylmethacrylate (PMMA), resin, or other materials with suitable properties for transmitting the radiation emitted by the SSL emitters 120. The conditioning element 140 can further include an optional converter material, such as phosphor, that emits light at a different frequency to produce the perception of white light or another desired color to the human eye. The converter material in the conditioning element 140 can be in addition to or in lieu of the converter material 130.

From the foregoing, it will be appreciated that specific embodiments of the invention have been described herein for purposes of illustration, but that various modifications may be made without deviating from the spirit and scope of the invention. For example, any of the features of the embodiments of the SSL devices 100 shown in FIGS. 3A, 3B, 4A, 5A and 6-11 can be interchanged and matched together to provide the desired light intensity distribution. Accordingly, the invention is not limited except as by the appended claims.

I claim:

1. A method for manufacturing a solid state lighting (SSL) emitter system, comprising:
arranging a first set of SSL emitters in a first emission area of an SSL emitter array, wherein the first set of SSL emitters covers a first percentage of the first emission area; and
arranging a second set of SSL emitters in a second emission area of the SSL emitter array,
wherein the second emission area is located outward of the first emission area, wherein the second set of SSL emitters covers a second percentage of the second emission area, and the first percentage is different from the second percentage and wherein a first primary emission direction of the first set of SSL emitters intersects a second primary emission direction of the first set of SSL emitters.

2. The method of claim 1, further comprising:
arranging a third set of SSL emitters in a third emission area, wherein the third emission area is located outward of the first emission area, and wherein the third SSL emitters cover a third percentage of the third emission area that is greater than the first percentage, and wherein a third primary emission direction of the third set of SSL emitters is parallel to the first primary emission direction of the first set of SSL emitters.

3. The method of claim 1 wherein the SSL emitters are arranged in a radial array.

4. The method of claim 3 wherein a spacing between SSL emitters along a radian decreases with an increasing distance from a center of the array.

5. The method of claim 1 wherein the first percentage is higher than the second percentage.

6. The method of claim 1 wherein the SSL emitters are generally symmetrical about at least one axis.

7. The method of claim 1 wherein intensity of light produced by individual SSL emitters of the first emission area is different than the intensity of light produced by individual SSL emitters of the second emission area.

8. A method for manufacturing a solid state lighting (SSL) emitter system, comprising:
arranging a first set of SSL emitters in a first emission area of an SSL emitter array; and
arranging a second set of SSL emitters in a second emission area of the SSL emitter array different from the first emission area, wherein a first distance between neighboring SSL emitters in the first emission area differs from a second distance between neighboring SSL emitters in the second emission area, and wherein a first primary emission direction of the first set of SSL emitters intersects a second primary emission direction of the first set of SSL emitters.

9. The method of claim 8 wherein the second emission area is peripheral to the first emission area, and wherein the individual SSL emitters in the second emission area are larger than the individual SSL emitters in the first emission area.

10. The method of claim 8 wherein spacing between the individual SSL emitters in the first emission area decreases with increasing distance from a center of the first emission area.

11. The method of claim 8, further comprising:
covering the SSL emitters with a converter material.

* * * * *